(12) United States Patent
Iu et al.

(10) Patent No.: US 10,026,630 B2
(45) Date of Patent: Jul. 17, 2018

(54) RETENTION AND INSULATION FEATURES FOR LAMP

(71) Applicant: Applied Materials, Inc., Santa Clara, CA (US)

(72) Inventors: Dongming Iu, Union City, CA (US); Joseph M. Ranish, San Jose, CA (US); Oleg V. Serebryanov, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 878 days.

(21) Appl. No.: 14/288,000

(22) Filed: May 27, 2014

(65) Prior Publication Data
US 2015/0348809 A1    Dec. 3, 2015

(51) Int. Cl.
*H01R 12/00* (2006.01)
*H05B 3/00* (2006.01)
(Continued)

(52) U.S. Cl.
CPC ........ *H01L 21/67115* (2013.01); *H01R 33/09* (2013.01); *H05B 3/0047* (2013.01); *H05B 3/06* (2013.01)

(58) Field of Classification Search
CPC .. H01L 21/67115; H05B 3/0047; H01R 13/41
(Continued)

(56) References Cited

U.S. PATENT DOCUMENTS 2,298,172 A * 10/1942 Rose ............... H01R 24/58
                                                200/51.09
3,056,941 A * 10/1962 Eriksson ........... H01K 1/46
                                                337/264
(Continued)

FOREIGN PATENT DOCUMENTS

JP         2912157 B2    6/1999
JP      2003503701 A     1/2003

OTHER PUBLICATIONS

International Search Report and Written Opinion for International Application No. PCT/US2015/021271 (APPM/021766PCT) dated Jun. 23, 2015.

*Primary Examiner* — Dana Ross
*Assistant Examiner* — Lawrence Samuels
(74) *Attorney, Agent, or Firm* — Patterson + Sheridan LLP (57) ABSTRACT

Embodiments of the present disclosure generally relate to an improved retention and insulation features for lamps used as a source of heat radiation in a thermal processing chamber. In one embodiment, a process chamber is provided. The process chamber includes a lamp assembly for thermal processing of semiconductor substrates, the lamp assembly has a lamp electrical connector and a first laterally operative element, a lamp assembly housing having a passage for receiving the lamp assembly, a power distribution assembly having a receptacle for receiving the lamp electrical connector and delivering power to the lamp electrical connector, and a spacer plate disposed between the lamp assembly (Continued)

housing and the power distribution assembly, wherein the spacer plate has a passage contoured to allow passage of the lamp electrical connector therethrough, and the spacer plate has a retention feature configured to engage or disengage the first laterally operative element.

10 Claims, 9 Drawing Sheets

(51) Int. Cl.
*H01L 21/67* (2006.01)
*H01R 33/09* (2006.01)
*H05B 3/06* (2006.01)

(58) Field of Classification Search
USPC ......... 219/405, 411, 390; 392/416; 439/626, 439/637; 118/724, 725
See application file for complete search history.

(56) References Cited

U.S. PATENT DOCUMENTS

| | | | |
|---|---|---|---|
| 3,859,554 A | 1/1975 | Preziosi et al. | |
| 4,077,694 A * | 3/1978 | Cobaugh | H01R 43/205 439/633 |
| 4,610,496 A * | 9/1986 | Schwartz | H01R 13/6276 439/345 |
| 4,854,899 A * | 8/1989 | Matthews | H01R 31/02 439/724 |
| 4,917,525 A * | 4/1990 | Duncan | H01R 13/625 285/93 |
| 4,934,961 A * | 6/1990 | Piorunneck | H01R 43/16 439/59 |
| 5,024,609 A * | 6/1991 | Piorunneck | H01R 12/721 439/60 |
| 5,137,454 A * | 8/1992 | Baechtle | H01R 12/57 439/267 |
| 5,509,826 A * | 4/1996 | White | H01R 12/7005 439/637 |
| 5,575,687 A * | 11/1996 | Tsai | H01R 12/721 439/637 |
| 5,800,213 A * | 9/1998 | Regnier | H01R 12/721 439/637 |
| 5,931,689 A * | 8/1999 | Patel | H01R 13/20 439/346 |
| 6,059,580 A * | 5/2000 | Konno | H01R 12/716 439/74 |
| 6,072,160 A * | 6/2000 | Bahl | C30B 31/12 219/405 |
| 6,135,828 A * | 10/2000 | Lalange | H01R 13/7032 439/188 |
| 6,315,615 B1 * | 11/2001 | Raistrick | H01R 12/585 439/637 |
| 6,350,964 B1 * | 2/2002 | Boas | H01L 21/67115 118/724 |
| 6,376,804 B1 * | 4/2002 | Ranish | H01L 21/67115 118/724 |
| 6,688,895 B1 * | 2/2004 | Fan | H01R 12/58 439/751 |
| 6,805,466 B1 | 10/2004 | Ranish | |
| 7,210,955 B2 * | 5/2007 | Ringler | H01R 12/585 439/381 |
| 7,410,364 B2 * | 8/2008 | Kishi | H01R 12/716 439/566 |
| 7,470,155 B1 * | 12/2008 | Soubh | H01R 12/716 439/579 |
| 7,509,035 B2 * | 3/2009 | Ranish | H01L 21/67115 118/50.1 |
| 7,544,067 B1 | 6/2009 | Hatano et al. | |
| 8,641,453 B2 * | 2/2014 | Jung | H05K 1/117 439/637 |
| 2006/0166560 A1 * | 7/2006 | Shuey | H01R 23/6873 439/637 |
| 2008/0199162 A1 * | 8/2008 | Ranish | H01K 1/46 392/407 |
| 2008/0199163 A1 * | 8/2008 | Ranish | H01K 1/28 392/407 |
| 2009/0137161 A1 * | 5/2009 | Diemer | H01R 13/05 439/775 |
| 2010/0029145 A1 * | 2/2010 | Balsells | H01R 13/03 439/827 |
| 2010/0059497 A1 * | 3/2010 | Ranish | F27B 17/0025 219/395 |

* cited by examiner

FIG. 1

SECTION A-A

RETENTION AND INSULATION FEATURES FOR LAMP

BACKGROUND

Field

Embodiments of the present disclosure generally relate to an apparatus for thermally processing a substrate. In particular, embodiments of the present disclosure relate to retention features for lamps used as a source of heat radiation in a thermal processing chamber.

Description of the Related Art

Rapid thermal processing (RTP) systems are employed in semiconductor chip fabrication to create, chemically alter or etch surface structures on semiconductor wafers. A typical RTP system may include a semiconductor processing chamber and a lamphead assembly located within the semiconductor processing chamber. A number of radiant heat sources, such as lamps, are positioned within the lamphead. The lamps generally include a bulb and a plug coupling to the bulb. The plug of the lamps has pins which mate to a receptacle provided on a printed circuit board (PCB) structure. The lamps may be powered through the PCB structure. When the bulb fails, the lamp is removed by pulling the pins out of the receptacle and a new lamp is placed back in the lamphead with the pins engaging with the receptacle.

To reduce the operating costs, there is always a need in the art to quickly and easily engage and disengage the lamp with a secured connection of the pins to the PCB structure without the need for complex tools.

SUMMARY OF THE DISCLOSURE

Embodiments of the disclosure generally relate to improved retention and insulation features for lamps used as a source of heat radiation in a thermal processing chamber. In one embodiment, a lamp assembly for use in a thermal processing chamber is provided. The lamp assembly includes a lamp for thermal processing of semiconductor substrates, the lamp has a lamp electrical connector having a laterally operative element provided on an exterior surface of the lamp electrical connector, and a power distribution assembly having a receptacle with an opening sized to allow passage of the lamp electrical connector and secure the laterally operative element upon fully insertion of the lamp electrical connector into the receptacle, the receptacle receives the lamp electrical connector and delivers power to the laterally operative element of the lamp electrical connector.

In another embodiment, the lamp assembly includes a lamp for thermal processing of semiconductor substrates, the lamp has a lamp electrical connector having a first laterally operative element provided on an exterior surface of the lamp electrical connector, and a power distribution assembly having a receptacle with an opening sized to allow passage of the lamp electrical connector, wherein the receptacle receives the lamp electrical connector and delivers power to the first laterally operative element of the lamp electrical connector through a contact feature, and wherein the receptacle has a second laterally operative element contoured to engage or disengage the first laterally operative element.

In yet another embodiment, a process chamber is provided. The process chamber includes a lamp assembly for thermal processing of semiconductor substrates, the lamp assembly has a lamp electrical connector and a first laterally operative element, a lamp assembly housing having a passage for receiving the lamp assembly, a power distribution assembly having a receptacle for receiving the lamp electrical connector and delivering power to the lamp electrical connector, and an insulating spacer plate disposed between the lamp assembly housing and the power distribution assembly, wherein the spacer plate has a passage contoured to allow passage of the lamp electrical connector therethrough, and the spacer plate has a retention feature configured to engage or disengage the first laterally operative element.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure generally relate to improved retention and insulation features for lamps used as a source of heat radiation in a thermal processing chamber, such as a rapid thermal processing (RTP) chamber. The improved lamp assembly allows an easy, fast replacement of a lamp by providing lamp electrical connectors and/or a power delivery board with retention features so that the lamp can be securely engaged or disengaged with the power delivery board without a complex tool. The retention features disclosed in this disclosure generally include laterally operative elements such as a contact spring, a spring-loaded member, a slider, a notch or groove, etc. As a result, the replacement of a faulty lamp can be done in a time-efficient and cost-efficient manner. Details of various embodiments are discussed below.

Exemplary Chamber Hardware

Figure 1:
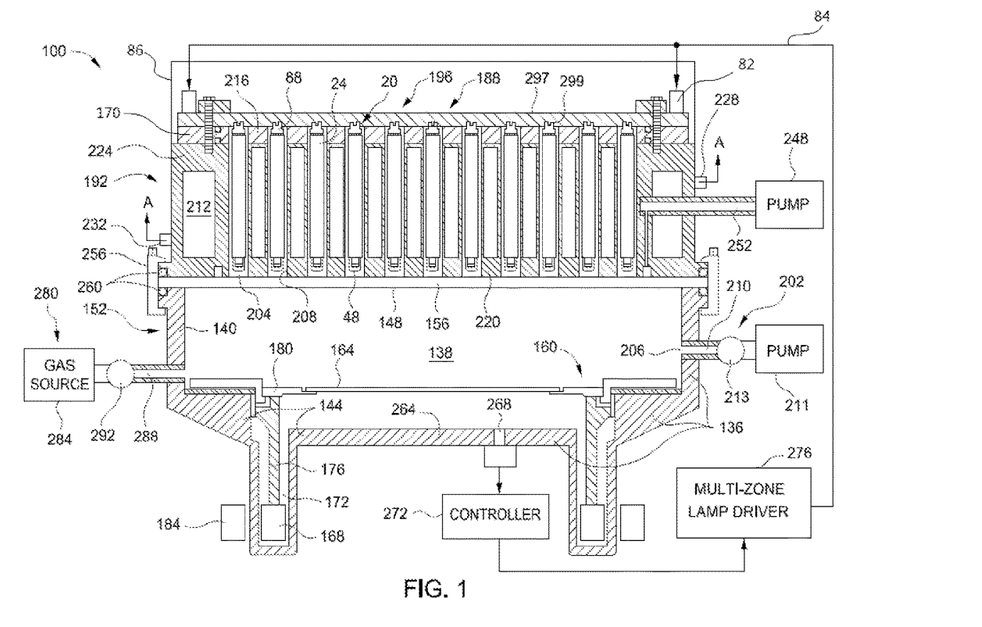
FIG. 1 is a schematic, cross-sectional view of a thermal processing chamber having an array of lamp assemblies.

FIG. 1 is a schematic, cross-sectional view of an RTP chamber 100 in which embodiments of the present disclosure may be used. The RTP chamber 100 is capable of providing a controlled thermal cycle that heats the substrate 164 for processes such as, for example, thermal annealing, thermal cleaning, thermal chemical vapor deposition, thermal oxidation and thermal nitridation. It is contemplated that embodiments of the present disclosure may also be used in epitaxial deposition chambers which are heated from the bottom, the top, or both, and other RTP chambers where bottom heating is used. The RTP chamber 100 includes chamber walls 136 enclosing a process zone 138. For example, the chamber walls 136 enclosing the process zone 138 can comprise sidewalls 140 and bottom walls 144 formed by a main body 152 and a top wall 148 formed by a transmission window 156 resting on the main body 152. The main body 152 may be made of stainless steel, although aluminum and other suitable materials may also be used. The window 156 is made of a material that is transparent to infrared light, such as clear fused silica quartz.

A substrate support 160 holds the substrate 164 during processing in the process zone 138. The substrate support 160 may include a rotatable structure that rotates the substrate 164 during processing. For example, the support 160 may include a magnetically levitated rotor 168 positioned within a channel 172 in the main body 152. The magnetically levitated rotor 168 supports a quartz support cylinder 176, on top of which is a support ring 180 to hold the substrate 164. A magnetic stator 184 located externally to the channel 172 containing the rotor 168 is used to magnetically induce rotation of the rotor 168 in the channel 172, which in turn causes rotation of the substrate 164 on the support ring 180. The substrate 164 may be rotated, for example, at about 100 to about 250 revolutions per minute.

A radiation source 188 directs radiation onto the substrate 164, and can be positioned above the substrate 164, such as in a ceiling 192 of the RTP chamber 100 above the window 156. The radiation source 188 generates radiation at wavelengths that heat the substrate 164, such as radiation having wavelengths of from about 200 nm to about 4500 nm. In one embodiment, the radiation source 188 may include a honeycomb array 196 of lamp assemblies 20. Each lamp assembly 20 has a lamp 48 which may be radiation emitting light bulbs such as tungsten-halogen lamps. The array 196 may include one or more approximately radial heating zones that can be independently modulated to control temperatures across the substrate 164. For processing a 300 mm (12 inch) wafer, for example, the radiation source 188 may include 409 lamps divided into 15 zones which are located in a radially symmetrical manner. Each zone can be independently controlled to provide fine control of the radial profile of heat delivered to the substrate 164. The radiation source 188 is capable of rapidly heating the substrate 164 for thermal processing, for example at a rate of from about 50° C./s to about 280° C./s.

Each lamp assembly 20 in the array 196 of lamp assemblies 20 is enclosed in a tubular lamp assembly housing 204. One end of the lamp assembly housing 204 is adjacent to the transmission window 156. The lamp assembly housing 204 may have a reflective inner surface 208 made of any suitable light reflecting material such as gold-plated aluminum. The reflective inner surface 208 increases the efficiency of light and heat transfer from the lamp assemblies 20 to the substrate 164. The lamp assembly housing 204 may be enclosed in a fluid cooling chamber 212 defined by upper and lower fluid chamber walls 216, 220 and a cylindrical fluid chamber side wall 224. Clamps 256 may be used to secure the main body 152, window 156, and cooling chamber 212 together. O-rings 260 are located between the window 156 and the cooling chamber 212 and between the window 156 and the main body 152 to provide a vacuum seal at those interfaces.

Figure 2:
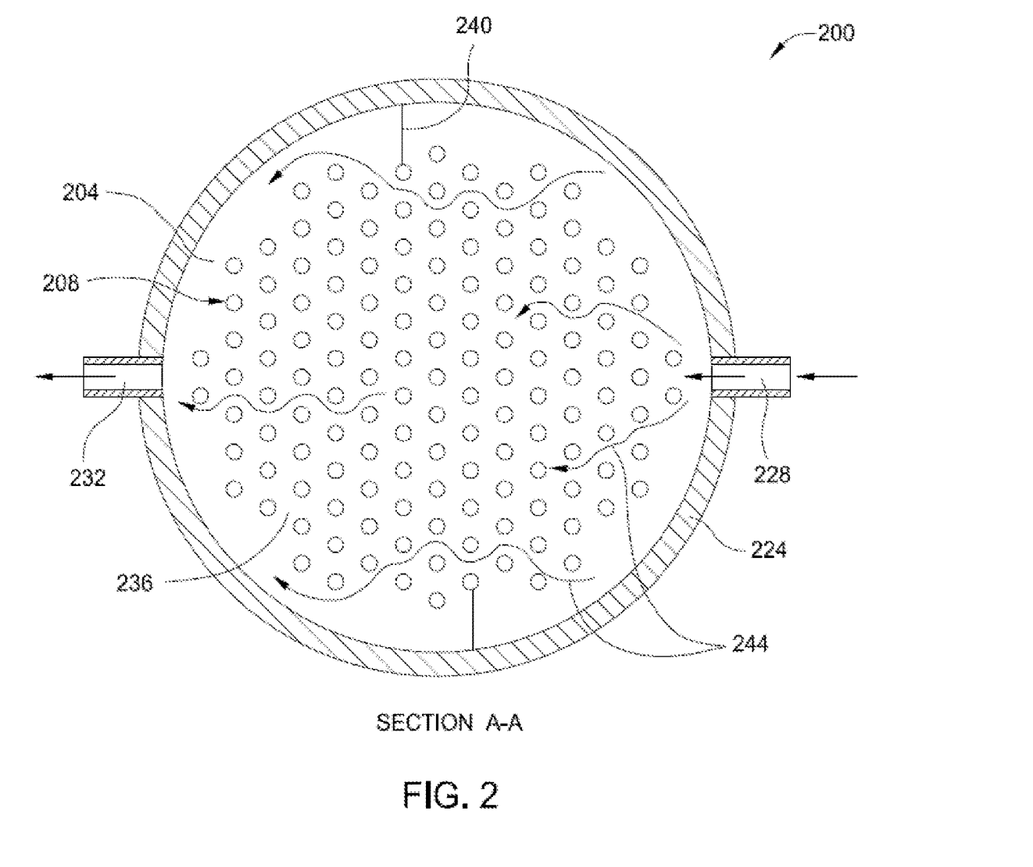
FIG. 2 is a schematic, top view of the array of the lamp assemblies in a cooling chamber of the thermal processing chamber.

A cooling fluid, such as, for example, water, can be introduced into the cooling chamber 212 through a cooling fluid inlet 228 and removed from the cooling chamber 212 through a cooling fluid outlet 232. FIG. 2 illustrates a top view of the array 196 of lamp assemblies 20 in lamp assembly housings 204 in the cooling chamber 212. Cooling fluid travels in the space 236 between the lamp assembly housings 204, and may be directed by baffles 240 to ensure an effective fluid flow to transfer heat from the lamp assemblies 20 in the lamp assembly housings 204. A vacuum pump 248 is provided to reduce the pressure in the lamp assembly housings 204. The vacuum pump 248 is coupled to the lamp assembly housings 204 by a conduit 252 in the cylindrical sidewall 224 and grooves in the bottom wall 220 of the cooling chamber 212.

In some embodiments, a pressurized source (not shown) of a thermally conductive gas, such as helium, may be provided and configured to cool the lamp assembly housing 204 with the thermally conductive gas, thereby facilitating thermal transfer between the lamps assemblies 20 and the cooling chamber 212. The pressurized source may be connected to the lamp assembly housing 204 through a port and a valve. The thermally conductive gas may be introduced in a manner so that the lamp assembly housing 204 (and therefore the lamp assembly 20 disposed therein) is operated under reduced pressure of the thermal conductive gas.

The lower wall 144 of the main body 152 may include a reflective plate 264 positioned below the substrate 164. One or more temperature sensors 268, such as pyrometers having fiber optic probes, may also be provided to detect the temperature of the substrate 164 during processing. The sensors 268 are connected to a chamber controller 272, which can use their output to determine a power level to supply to individual lamp assemblies 20 and to groups of lamp assemblies 20 in a zone. Each group of lamp assemblies 20 can be separately powered and controlled by a multi-zone lamp driver 276, which is in turn controlled by the controller 272.

A gas supply 280 can provide a process gas into the process zone 138 and control the atmosphere in the RTP chamber 100. The gas supply 280 includes a source 284 of process gas and a conduit 288 having a flow control valve 292 that connects the source 284 to a gas inlet (not shown) in the RTP chamber 100 to provide gas in the RTP chamber 100. An exhaust 202 controls the pressure of gas in the RTP chamber 100 and exhausts process gas from the RTP chamber 100. The exhaust 202 may include one or more exhaust ports 206 that receive spent process gas and pass the spent gas to an exhaust conduit 210 that feeds one or more exhaust pumps 211. A throttle valve 213 in the exhaust conduit 210 controls the pressure of the gas in the RTP chamber 100.

The RTP chamber 100 includes a power delivery system, such as a printed circuit board (PCB) structure 297 provided on top of the upper cooling fluid chamber wall 216. The PCB structure 297 may include receptacles 299 configured to receive electrical connectors of the lamp assembly 20. The PCB structure 297 may also include electrical traces and other electrically conductive elements to deliver power and signals to the lamp assemblies 20 from the multi-zone lamp driver 276 and controller 272. Each of the plurality of lamp assemblies 20 is inserted into the PCB structure 297 for electrical connection through the driver 276 to a power supply source (not shown).

The RTP chamber 100 may also include a spacer plate 170 supporting the PCB structure 297 or the lamp assemblies 20. The spacer plate 170 and the PCB structure 297 form the upper fluid chamber wall 216 while the window 156 forms the lower fluid chamber wall 220. The spacer plate 170 may be made of an electrically-insulating material such as a polyimide, plastic or ceramic material. As will be discussed in more detail below, the spacer plate 170 may include a plurality of receptacle pairs (see FIGS. 4-9) each configured to allow the passage of electrical connectors of the lamp assembly 20. The receptacles may be formed by drilling holes in the spacer plate 170. The holes may function as sealing sockets to prevent electrical arcing between the electrical connectors.

A number of power supply terminal blocks 82 may be located on the PCB structure 297. The terminal blocks are electrically connected to terminal block pads and power distribution traces of the PCB structure 297. The lamps of each zone, in one configuration, are connected in pairs. Thus, for a lamp zone having 30 lamps, for example, there are 15 traces from each of two terminal block pads, providing a supply and return for each lamp pair. Cables 84 connect the terminal blocks 82 to the multi-zone lamp driver 276. The cables 84 may extend through the top surface of a protective cover 86. The cover 86 covers all exposed electrical connections, protecting personnel from potential electrical shock.

Figure 3A:
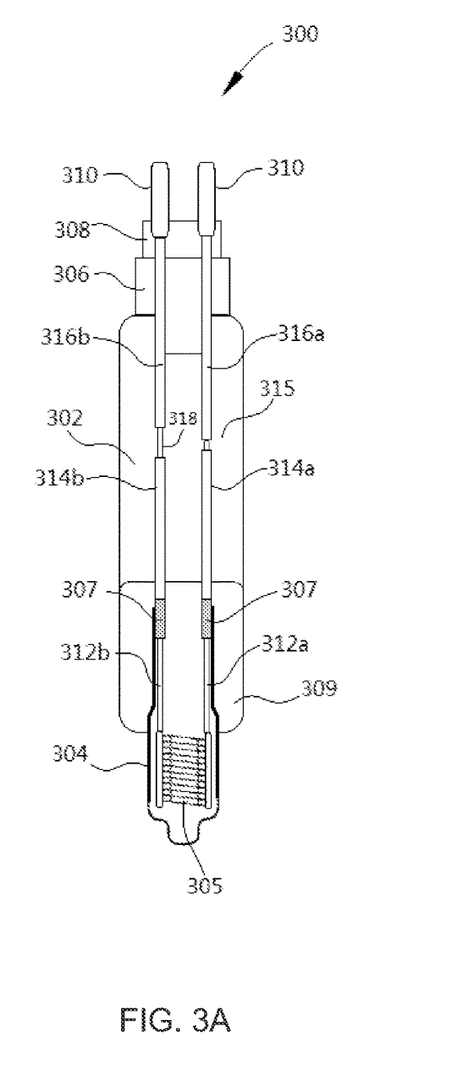
FIG. 3A is a schematic, cross-sectional view of an exemplary lamp assembly that may be used in a thermal processing chamber according to embodiments of the disclosure.

FIG. 3A is a schematic, cross-sectional view of an exemplary lamp assembly 300 that may be used in a thermal processing chamber, such as the RTP chamber 100, according to embodiments of the disclosure. The lamp assembly 300 generally includes a lamp body 302, a lamp bulb 304, and a lamp base 306. The lamp base 306 may include an optional lamp plug 308 housing a pair of electrical connectors 310. The lamp bulb 304 is a quartz capsule housing a tungsten filament 305. Tungsten leads 312a, 312b extend from the filament 305 and are each attached (e.g., welded) to molybdenum foil 307. Molybdenum leads 314a, 314b are attached to (e.g., welded) and extend from the molybdenum foil 307. A quartz press seal 309 encapsulates and creates a hermetic seal about the molybdenum foil 307. The molybdenum leads 314a, 314b extend out of the press seal 309 for electrical connection.

The press seal 309 and molybdenum leads 314a, 314b are coupled or inserted into the lamp body 302, which may be a stainless steel cylinder, where the molybdenum leads 314a, 314b are connected (e.g., welded) to a conductive pin assembly 316a, 316b extending through the lamp body 302. A fuse 318 is serially attached between at least one of the molybdenum leads 314a, 314b and the conductive pin assembly 316a, 316b. The lamp body 320 is filled with a ceramic potting compound 315, and the end of the lamp body 302 is sealed with lamp plug 308. The lamp plug 308 has electrical connectors 310 extending therethrough and electrically connected to the conductive pin assembly 316a, 316b. The electrical connectors 310 are inserted through a spacer plate, such as the spacer plate 170 from FIG. 1, and into respective electrically conductive receptacles 299 formed in the PCB structure 297 for connection to a power supply. The lamp base 306 and/or the lamp plug 308 may be made from a flexible material, such as an elastomer material, to accommodate imperfect alignment between the electrical connectors 310 and the receptacle pairs formed within the spacer plate.

As will be discussed below in more detail, one or both of the electrical connectors 310 may include a circumferential notch adapted to receive a retention feature provided within the spacer plate (such as the spacer plate 170 shown in FIG. 4) to engage or disengage the lamp assembly 300 with a PCB structure, such as the PCB structure 297 shown in FIG. 1.

Figure 3B:
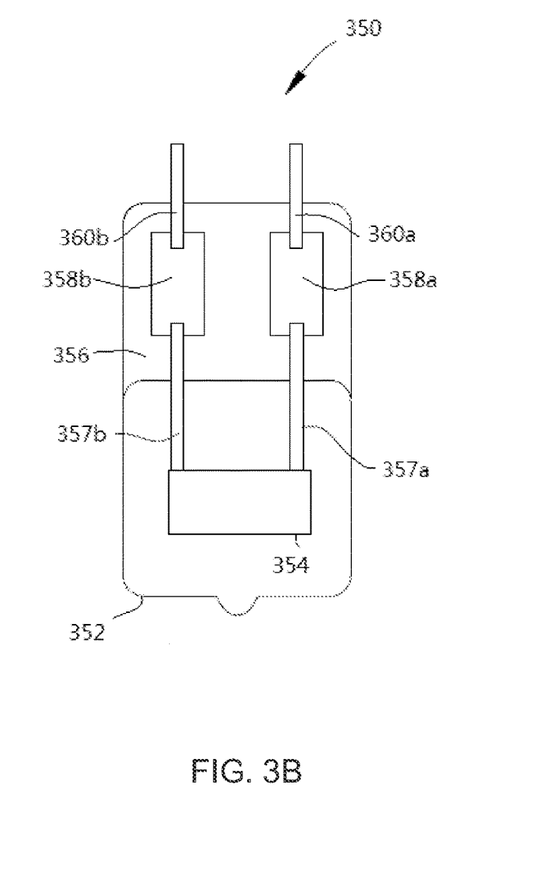
FIG. 3B is a schematic, cross-sectional view of another exemplary lamp assembly that may be used in a thermal processing chamber according to embodiments of the disclosure.

FIG. 3B is a schematic, cross-sectional view of another exemplary lamp assembly 350 that may be used in a thermal processing chamber, such as the RTP chamber 100, according to embodiments of the disclosure. It should be noted that the concept and features described in FIGS. 3A and 3B are equally applicable to various embodiments discussed in this disclosure. In general, the lamp assembly 350 includes a light transmissive capsule 352 that contains a filament 354, and a press seal 356 coupling to the light transmissive capsule 352. The lamp assembly 350 is a baseless lamp assembly that does not use the stainless steel lamp body or ceramic potting compound as used in the lamp assembly 300 of FIG. 3A. The filament 354 electrically connects to metal foils 358a, 358b disposed within the press seal 356 by filament leads 357a, 357b, respectively. The press seal 356 encapsulates and creates a hermetic seal about the metal foils 358a, 358b. The metal foils 358a, 358b are in electrical communication with electrical connectors 360a, 360b extending through the press seal 356. If desired, the end of the electrical connectors 360a, 360b may extend through a plug (not shown) to insert through a spacer plate, such as the spacer plate 170 from FIG. 1, and into respective electrically conductive receptacles 299 formed within the PCB structure 297 for distributing power to the filament 354. In some cases, the at least one of the electrical connectors 360a, 360b of the lamp assembly 350 may have a circumferential notch adapted to receive a slider provided within the spacer plate (such as the spacer plate 170 shown in FIG. 4) to engage or disengage the lamp assembly 350 with the PCB structure 297.

The lamp assembly 350 may or may not have a fuse (not shown) in the light transmissive capsule 352 or the press seal 356. The fuse is generally provided to limit arcing and potential explosion in the lamp during lamp failure. The fuse may be provided external to the light transmissive capsule 352 and the press seal 356 to prevent undesirable cracking or breaking of the capsule during lamp failure. In cases where the lamp assembly 350 is a simple capsule/fuse style (i.e., the fuse is incorporated internal or external to the lamp assembly 350), the fuse can be replaced along with the lamp assembly 350. In cases where the lamp assembly 350 is a simple capsule style (i.e., the fuse is not used in the lamp assembly 350), the lamp assembly 350 may optionally provide a fuse to be connected to the electrical connectors 360a, 360b. In cases where the fuse is provided external to the light transmissive capsule 352 and the press seal 356, the lamp assembly 350 may include additional components to provide sufficient rigidity to the electrical connectors 360a, 360b to absorb the compressive forces applied during insertion of the lamp assembly 350 into the PCB structure 297 (i.e., prevents the fuse from undergoing compression). Various components used to enhance rigidity of the electrical connectors or wires/leads are described in U.S. patent application Ser. No. 14/199,563, filed on Mar. 6, 2014, entitled "SIMPLIFIED LAMP DESIGN," which is incorporated herein by reference in its entirety and for all purposes. In some embodiments, the fuse may be optionally incorporated in other parts of the circuit, e.g., the PCB structure, and not required in the lamp assembly 350.

The lamp assembly 350 shown in FIG. 3B may be advantageous over the lamp assembly 300 shown in FIG. 1 in certain applications since a number of expensive parts, such as stainless steel lamp body or ceramic potting compound, are eliminated.

Exemplary Retention Features for Lamp Assembly/PCB Structure

Figure 4:
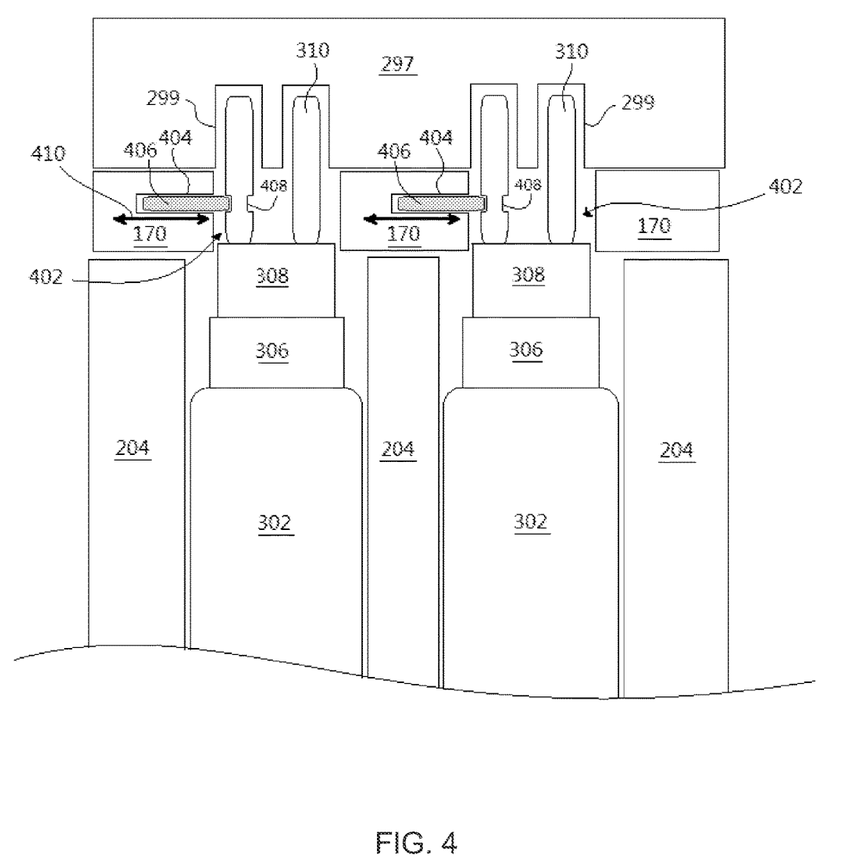
FIG. 4 depicts a lamp assembly mounted within a PCB structure, a spacer plate and a lamp assembly housing according to embodiments of the disclosure.

FIG. 4 depicts a lamp assembly, like those shown in FIGS. 3A and 3B, mounted within the PCB structure 297, the spacer plate 170 and the lamp assembly housing 204 according to embodiments of the disclosure. For the sake of clarity, the simplified lamp assembly 300 of FIG. 3A is illustrated and discussed in conjunction with FIG. 4. The spacer plate 170 is disposed between the PCB structure 297 and the lamp assembly housing 204. The spacer plate 170 has a passage or receptacle 402 contoured to allow passage of the lamp electrical connector 310 and the lamp plug 308 (if used). Upon fully insertion of the lamp electrical connectors into the electrically conductive receptacles 299 formed in the PCB structure 297, each lamp electrical connector 310 sits within an electrically conductive receptacle 299 formed within the PCB structure 297 to make electrical contact with the electrical contact terminals (not shown) formed in the PCB structure 297, though which power is supplied to the lamp assembly from a power source. In some embodiments where the lamp plug 308 is used, the lamp plug 308 may include a circumferential groove (not shown) adapted to receive an O-ring to prevent arcing between the electrical connectors 310 and from electrical connectors 310 to ground.

In one embodiment, the spacer plate 170 is also provided with a retention feature 406 to engage and disengage the lamp assembly with the PCB structure 297. The retention feature 406 may be a laterally operative element such as a bar, a pin, or the like, configured to slide axially within a channel 404 formed within the spacer plate 170. In one example, the retention feature 406 is a spring-loaded pin axially confined within the channel 404. The channel 404 is extended in substantially perpendicular relationship with the longitudinal direction of the passage or receptacle 402 and also the passage of the lamp assembly housing 204. The channel 404 facilitates alignment of the retention feature 406 with an engaging feature formed on an exterior surface of the lamp electrical connector 310. The engaging feature may be a circumferential notch 408 configured to receive the retention feature 406, such as the spring-loaded pin, upon full insertion of the lamp electrical connector 310 into the electrically conductive receptacle 299. The circumferential notch 408 may be provided on one or both lamp electrical connectors 310 of the lamp assembly.

In operation, once the lamp assembly is inserted into the lamp assembly housing 204, the retention feature 406 slides axially along a direction 410 substantially perpendicular to the longitudinal direction of the passage or receptacle 402 and snaps into the circumferential notch 408 in a lock position without rotation. The lamp assembly may be further rotated clockwise/counterclockwise to electrically engage the electrical connectors 310 with electrical contacts provided within the electrically conductive receptacle 299. The lamp assembly can be removed from the PCB structure 297 in a reverse order. The retention feature 406 and the circumferential notch 408 therefore provide a snap-fit engagement, which enables a secured electrical connection and easy release of the lamp assembly from the PCB structure 297. While not discussed, it is contemplated that the retention feature 406 may be any other suitable engagement features to allow easy, fast replacement of the lamp assembly.

Figure 5A:
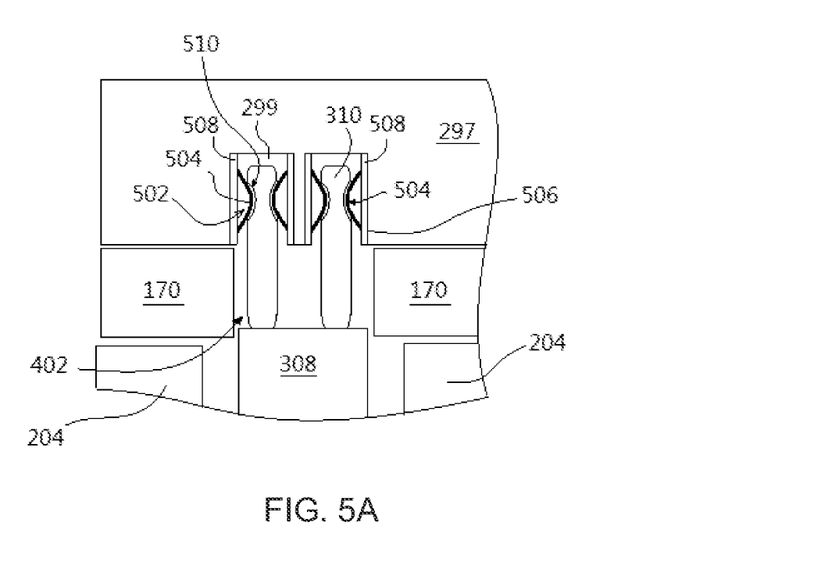
FIG. 5A depicts a schematic sectional view of a PCB structure having a contact feature provided within a receptacle formed in the PCB structure.

In some embodiments, the PCB structure 297 may provide with retention features to additionally or alternatively provide electrical/physical connection with the lamp assembly. FIG. 5A depicts a schematic sectional view of the PCB structure 297 having a contact feature 502 provided within the receptacle 299 formed in the PCB structure 297. In one embodiment, the contact feature 502 may be a laterally operative element such as a cantilever-type spring contact configured to receive and secure electrical connectors 310 of the lamp assembly in place upon full insertion of the lamp electrical connectors into the electrically conductive receptacles 299. In the embodiment shown in FIG. 5A, each cantilever-type spring contact has two relatively resilient metal blades 504 each curves inwardly from sidewalls 506 of the receptacle 299 to form a radius bend. In some embodiments, the metal blades are not curved and the contact is made at the unconnected end. One or both of the electrical connectors 310 may have a corresponding laterally operative element, such as a circumferential groove 510, which has a profile substantially corresponds to the radius bends in order to establish a contact point on the contact feature 502. It is understood that the cantilever-type spring contact may not need both metal blades to be resilient since concept could also work with one resilient metal blade which presses the electrical connector 310 against less resilient or non-resilient metal blade. In addition, each receptacle 209 may have any desired number of contact feature 502, such as between about 1 to about 10 contact features, for example about two, four or more contact features.

Figure 5B:
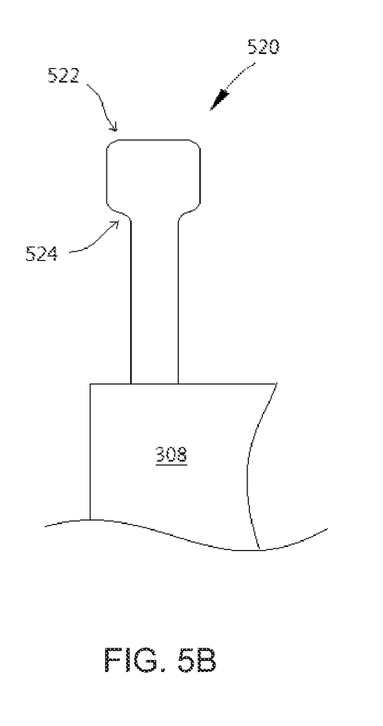
FIGS. 5B and 5C depict a partial, schematic sectional view of two exemplary electrical connectors that may be used to enhance electrical connection between the retention feature and the electrical connectors.
Figure 5C:
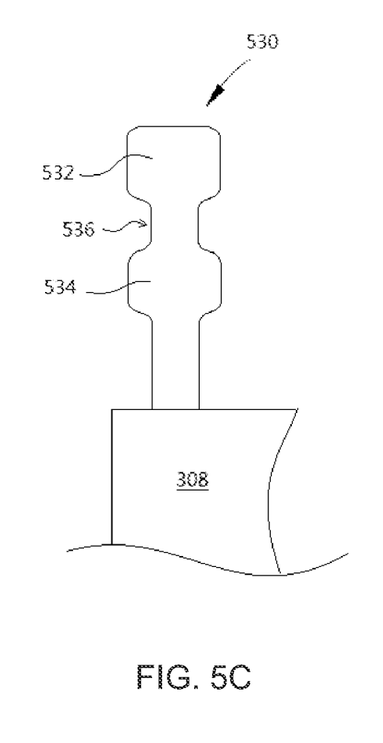

The retention features (e.g., cantilever-type spring contacts) are in electrical communication with electrical traces 508 formed on the sidewalls 506, though which power is supplied to the lamp assembly from a power source. While not shown in detail, it is contemplated that the electrical traces 508 formed on the sidewalls 506 of the receptacle 299 may include a power supply terminal and a ground terminal required to deliver power from the power source. It is also contemplated that the electrical connectors 310 may have a different profile shape to mate with the radius bends. FIGS. 5B and 5C depict a partial, schematic sectional view of two exemplary electrical connectors 520, 530 that may be used to enhance electrical connection between the retention feature and the electrical connectors 520, 530. For clarity, only one electrical connector of the lamp assembly is shown. The electrical connectors 520, 530 function similar to the electrical connectors 310 shown in FIG. 5A, except that the electrical connectors 520 have its second end 524 (opposing the first end 522) inwardly tapering towards the lamp plug 308, while the electrical connectors 530 have two flange portions 532, 534 defining the circumferential groove 536 in between to fit the retention feature.

In operation, once the lamp assembly is inserted into the lamp assembly housing 204, the electrical connectors 310 of the lamp assembly that pass through the spacer plate 170 are in contact with the contact feature 502. In cases where cantilever-type spring contacts are used, the radius bends of the metal blades 504 are compressed inwardly when initially contacted distal ends of the electrical connectors 310 and then resiled outwardly to its natural state once the radius bends of the metal blades 504 is snapped into the circumferential groove 510 without rotation.

Figure 6:
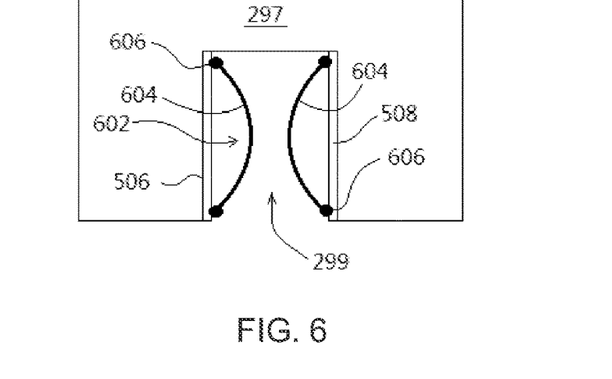
FIG. 6 depicts an enlarged, schematic sectional view of a portion of the PCB structure having a contact feature provided within electrically conductive receptacles according to an alternative embodiment of the present disclosure.

FIG. 6 depicts an enlarged, schematic sectional view of a portion of the PCB structure 297 having a laterally operative element such as a contact feature 602 provided within electrically conductive receptacles 299 according to an alternative embodiment of the present disclosure. The contact feature 602 is similar in structure to the contact feature 502 of FIG. 5A except that both ends of the relatively resilient metal blades 604 are spot-welded or soldered 606 to the sidewalls 506 of the receptacles 299 to increase the frictional force between the receptacles 299 and the contact feature 602. Similarly, the contact feature 602 is in electrical communication with electrical traces 508 formed on the sidewalls 506, though which power is supplied to the electrical connectors of the lamp assembly (not shown) from a power source. In some embodiments, the retention force of the retention feature may be further increased by making the metal blades 604 less circular and more angular.

Figure 7A:
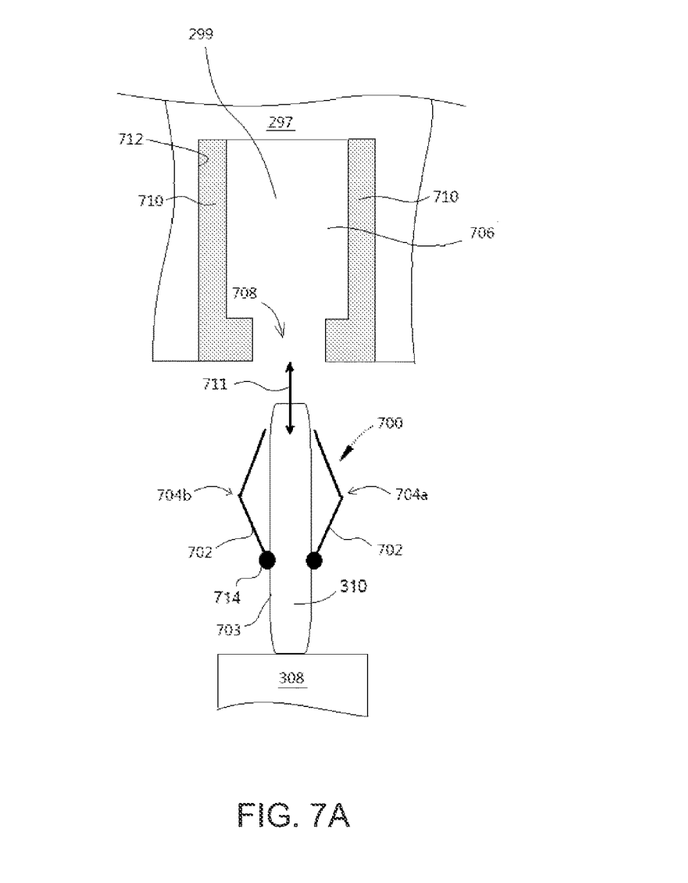
FIG. 7A depicts an enlarged, schematic sectional view of a PCB structure and a lamp assembly according to embodiments of the disclosure.

FIG. 7A depicts an enlarged, schematic sectional view of a PCB structure and a lamp assembly according to embodiments of the disclosure. FIG. 7A is similar in concept to FIG. 4 except that the electrical connectors of the lamp assembly have an engaging feature 700 to be engaged with the engaging feature on the PCB structure or within the receptacle of the PCB structure, thereby enhancing electrical/physical connection between the electrical connectors and the PCB structure. For clarity, only one electrical connector of the lamp assembly is shown in FIG. 7A. It is contemplated that the retention features discussed herein can be provided on one or both electrical connectors of the lamp assembly.

In FIG. 7A, the electrical connector 310 has an engaging feature 700 provided thereon to allow easy, fast engagement of the lamp assembly with the PCB structure 297 along the direction 711. The engaging feature 700 may be a laterally operative element such as a contact spring 702. Each contact spring 702 may have two relatively resilient metal leads extending symmetrically and outwardly from the exterior surface 703 of the electrical connector 310. Each metal lead may be bent into a substantially V-shaped spring portion with its apex 704a, 704b pointing away from each other. The PCB structure 297 has a receptacle 706, such as the electrically conductive receptacles 299 of FIG. 1, with an opening 708 configured to allow passage of the electrical connector 310. The radial distance between two apexes 704a, 704b may be slightly larger than the diameter of the opening 708. Electrical traces (not shown) are embedded within a PCB connector 710, which is provided on the sidewalls 712 of the receptacle 706. Power can be supplied to the lamp assembly through the PCB connector 710 from a power source. In some embodiments, one end of the relatively resilient metal leads may be spot-welded or soldered 714 to the exterior surface 703 of the electrical connector 310 to increase the frictional force between the PCB connectors 710 and the engaging feature 700.

It is understood that the contact spring 702 may not need both metal leads to be resilient since concept could also work with one resilient metal lead which presses the electrical connector 310 against less resilient or non-resilient metal lead when the electrical connector 310 is inserted into the receptacle 299. In addition, each electrical connector 310 may have any desired number of engaging feature 700, such as between about 1 to about 10 engaging features, for example about two, four or more contact features.

In operation, the V-shaped spring portions of the metal lead are compressed inwardly when initially contacted the PCB connectors 710 and then resiled outwardly to their natural state upon full insertion of the lamp electrical connectors 310 into the receptacle 299 without rotation. Therefore, a snap-fit engagement between the V-shaped spring portions and the PCB connectors 710 is established. An operator may remove a faulty lamp assembly by pulling the lamp electrical connector 310 out of the receptacle 299.

Figure 7B:
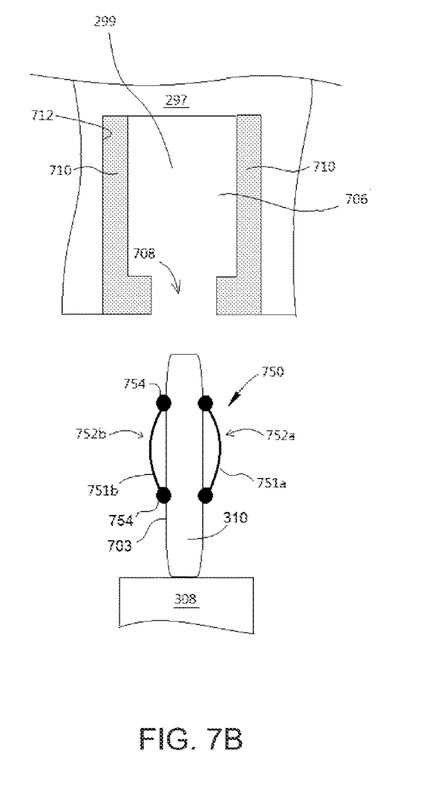
FIGS. 7B and 7C depict possible variations of the engaging feature shown in FIG. 7A.
Figure 7C:
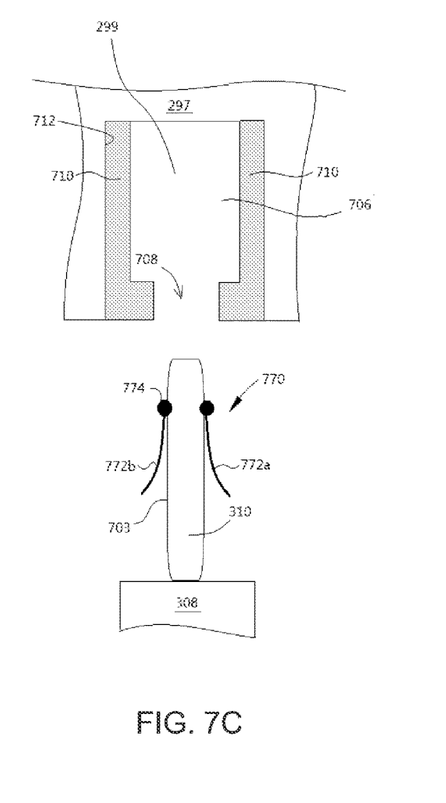

FIGS. 7B and 7C depict possible variations of the engaging feature 700 shown in FIG. 7A. In FIG. 7B, the engaging feature 750 is a suitable laterally operative element, such as a contact spring similar to the engaging feature 700 except that both ends of the relatively resilient metal leads 751a, 751b are spot-welded or soldered 754 to the exterior surface 703 of the electrical connector 310 to increase the frictional force between the engaging feature 700 and the electrical connector 310 of the lamp assembly. The metal leads may be bent into a more curved or rounded shape as opposed to the V-shaped spring portion shown in FIG. 7A. In FIG. 7C, the engaging feature 770 is a contact spring similar to the engaging feature 700 except that the two relatively resilient metal leads 772a, 772b are extended symmetrically and outwardly from the exterior surface 703 of the electrical connector 310 with flared out ends pointing towards the lamp plug 308, or away from the receptacle 299. One end of the metal leads 772a, 772b is spot-welded or soldered 774 to the exterior surface 703 of the electrical connector 310.

In operation, the lamp assembly is inserted into the lamp assembly housing (not shown) and the metal leads of the retention features 750, 770 are compressed inwardly when initially contacted the PCB connectors 710 and then resiled outwardly to their natural state upon full insertion of the lamp electrical connectors 310 into the receptacle 299 without rotation. Therefore, a snap-fit engagement between the retention features 750, 770 and the PCB connectors 710 is established. Similarly, an operator may remove a faulty lamp assembly by pulling the lamp electrical connectors 310 out of the receptacle 299.

Figure 8:
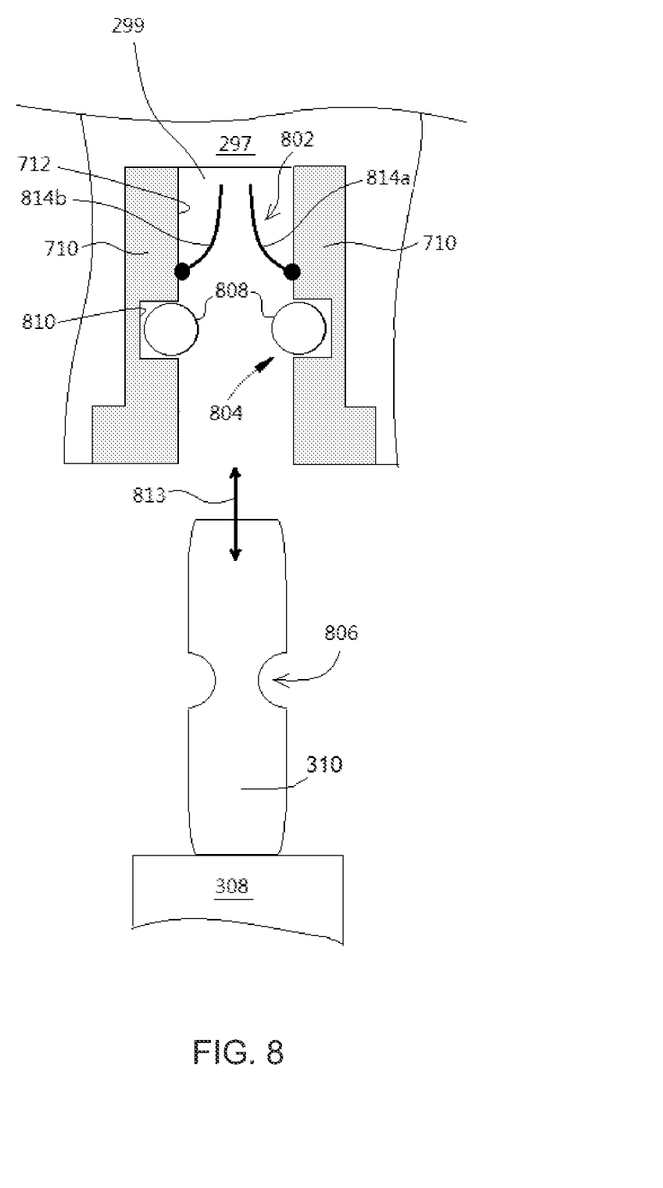
FIG. 8 depicts an enlarged, schematic sectional view of a PCB structure and a lamp assembly according to embodiments of the disclosure.

FIG. 8 depicts an enlarged, schematic sectional view of a PCB structure and a lamp assembly according to embodiments of the disclosure. FIG. 8 is similar in concept to FIG. 5A except that the PCB structure 297 has a contact feature 802 that is separated from the engaging feature 804 provided within the receptacle 299. In general, the engaging feature 804 is a laterally operative element provided to engage with the mating groove 806 formed on the electrical connectors 310 of the lamp assembly, thereby enhancing electrical/physical connection between the electrical connectors and the PCB structure 297. The lamp electrical connector 310 can move along the direction 813 within the receptacle 299. For clarity, only one electrical connector of the lamp assembly is shown in FIG. 8. It is contemplated that the engaging and retention features discussed herein can be provided on one or both electrical connectors of the lamp assembly and the PCB structure.

In one embodiment, the electrical connector 310 has a laterally operative element, for example a circumferential C-shaped groove 806 adapted to be engaged with the retention feature 804 of the PCB structure 297. The retention feature 804 may be spring-loaded balls 808 confined in a locking channel 810 provided on the sidewalls 712 of the receptacle 299. It is contemplated that the retention feature 804 may be a linear spring member, for example, a generalization of a "C" ring type spring commonly used on cylindrical cross sectioned parts. The circumferential groove 806 has a symmetrical cross-section which substantially corresponds to the shape of the spring-loaded balls 808. When contacted with the lamp electrical connector 310, the spring-loaded balls 808 roll axially within the locking channel 810 in a direction perpendicular to the longitudinal direction of the receptacle 299. The locking channel 810 facilitates alignment of the spring-loaded balls 808 with the circumferential groove 806 of the electrical connector 310 once the electrical connector 310 is inserted into the receptacle 299. The retention feature 804 may also function as sealing block to prevent electrical arcing between the electrical connectors and from the electrical connectors to ground.

The contact feature 802 is configured to deliver power to the lamp assembly from a power source (not shown) through a PCB connector 710 formed on the sidewalls 712 of the receptacle 299. The contact feature 802 may be any electrically conductive element that is suitable for establishing an electrical connection with the lamp electrical connector 310 upon full insertion of the lamp electrical connector 310 into the receptacle 299. In one embodiment, the contact feature 802 is a cantilever-type spring contact. The cantilever-type spring contact may have two relatively resilient metal blades 814a, 814b each curves inwardly from sidewalls 712 of the receptacle 299. One or both ends of the metal blades 814a, 814b may be spot-welded or soldered on the sidewalls 712. While not shown in detail, it is contemplated that the electrical traces (e.g., power supply terminal and ground terminal required to deliver power from the power source) may be provided within the PCB connector 710.

It is understood that the contact feature 802 may not need both metal blades to be resilient since concept could also work with one resilient metal blade which presses the electrical connector 310 against less resilient or non-resilient metal blade when the electrical connector 310 is inserted into the receptacle 299. In addition, each receptacle 299 may have any desired number of contact feature 802, such as between about 1 to about 10 engaging features, for example about two, four or more contact features.

In operation, once the lamp assembly is inserted into the lamp assembly housing (not shown), the electrical connector 310 of the lamp assembly makes contact with the retention feature 804, which are spring-loaded balls 808 in this case. The balls 808 are compressed radially and inwardly when initially contacted distal ends of the lamp electrical connectors 310 and then released outwardly once the spring-loaded balls 808 are snapped into the circumferential groove 806 upon full insertion of the lamp electrical connector into the receptacle 299 without rotation. An operator may remove a faulty lamp assembly by pulling the lamp electrical connector 310 out of the receptacle 299.

Figure 9:
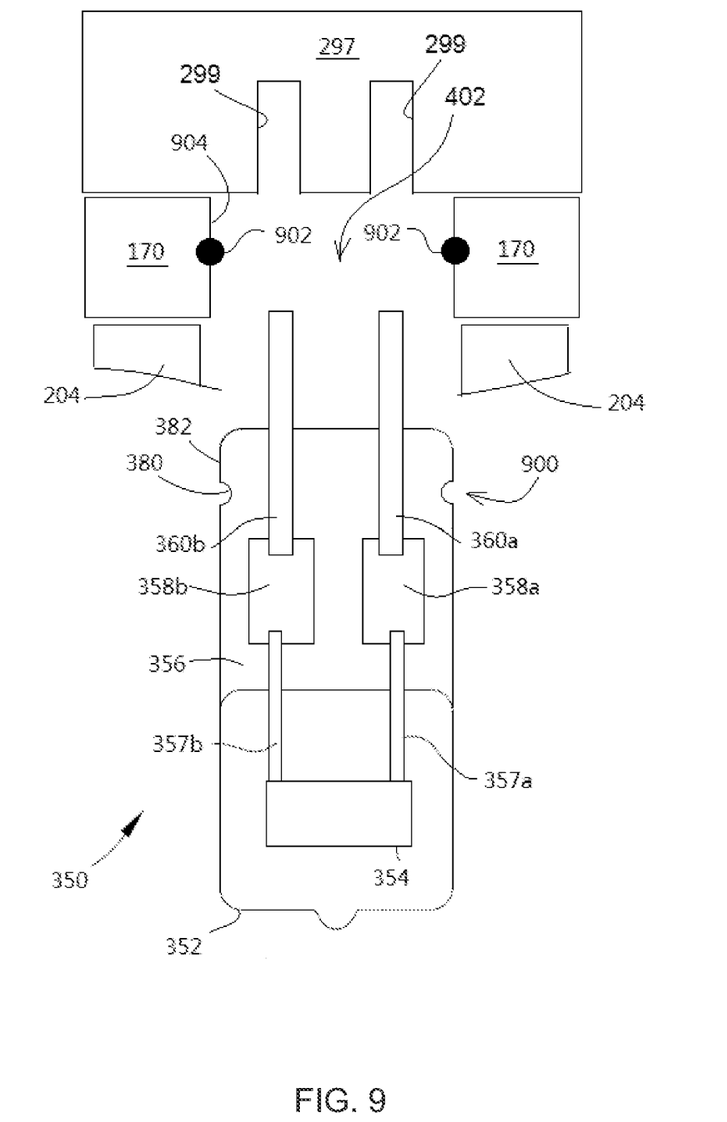
FIG. 9 depicts the lamp assembly of FIG. 3B having a retention feature according to embodiments of the disclosure.

It is contemplated that the concept discussed above is also applicable to other baseless lamp assemblies that do not use the stainless steel lamp body or ceramic potting compound, such as the lamp assembly 350 shown in FIG. 3B. FIG. 9 depicts the lamp assembly 350 of FIG. 3B having a retention feature 900 according to embodiments of the disclosure. The lamp assembly 350 is generally identical to the lamp assembly discussed above in FIG. 3B except that the retention feature 900 is provided on the exterior surface 382 of the press seal 356. In one embodiment, the retention feature 900 is a laterally operative element, for example a circumferential groove 380 configured to be engaged with a corresponding laterally operative element, for example an engaging feature 902 provided on a spacer plate, such as the spacer plate 170 of FIG. 1. The engaging feature 902 may be a bump or a flange radially extended outwardly from an inner surface 904 of the spacer plate 170. The bump or flange should be compliant enough to slide over the press seal 356 and snap into the circumferential groove 380. Alternatively, the retention feature 900 may be provided on the inner surface 904 of the spacer plate 170 while the engaging feature 902 is provided on the exterior surface 382 of the press seal 356. In either case, once the lamp electrical connectors 360a, 360b are fully inserted into the receptacle 299, the engaging feature 902 snaps into the retention feature 900 and thus the lamp assembly 350 is engaged with the PCB structure 297 without rotation. A portion or the entire press seal 356 of the lamp assembly 350 is also received within the passage or receptacle 402, with the lamp electrical connectors 360a, 360b fully inserted into the respective receptacle 299. An operator may remove the faulty lamp assembly by pulling the lamp electrical connectors out of the receptacle 299.

While not shown in detail, it is contemplated that the electrical traces (e.g., power supply terminal and ground terminal required to deliver power from the power source) may be provided within the receptacle 299, through which power is distributed to the filament 354 from a power source (not shown). Various electrical contacts, traces or PCB connectors as discussed above with respect to FIGS. 4-8 may be used within the receptacle 299 for desired electrical connection. It is also contemplated that any other suitable engagement features may be used in place of the retention feature 900 and engaging feature 902 to allow easy, fast replacement of the lamp assembly.

In some embodiments, an insulating coating or covering may be applied to at least the electrical connectors 360a, 360b exposed outside the press seal 356. In some embodiments, the tip or distal end of the electrical connectors 360a, 360b engaging the PCB structure may be free from the insulating coating or covering. Suitable insulating coating material may include high temperature plastic (e.g., fluorocarbon polymer), red silicone (iron oxide filled), high temperature epoxy, high temperature phenolic resin, polyimide, or a ceramic or glass slip. Suitable coverings may include high temperature plastic shrink or regular tubing, braided glass, silica, or woven ceramic fabric. The covering may be slightly oversized in diameter to accommodate lamphead-power delivery board misalignment. The covering may be held by insulating conformable adhesive applied at the cooler regions, shrink tubing, wire overwraps, etc. The insulating coating or covering provides robustness of the lamp electrical connectors 360a, 360b and is helpful in arc suppression in reduced pressure environment (e.g., few Torr) containing an easily ionized gas such as helium.

In some embodiments, the light transmissive capsule 352 that contains a filament 354 may include a white diffuse coating about the end towards the press seal 356. The diffuse coating may cover the press seal 356 and in some cases may cover even most of the lamp electrical connectors 360a, 360b, leaving only the tip or distal end of the lamp electrical connectors 360a, 360b bare for connection with the PCB structure.

Benefits of the present disclosure include an easy, fast replacement of a lamp assembly by providing the lamp electrical connectors and/or the power delivery board with retention features so that the lamp assembly can be securely engaged or disengaged with the power delivery board without a complex tool. As a result, the replacement of a faulty lamp can be done in a time-efficient and cost-efficient manner and therefore the overall costs and throughput are improved.

While the foregoing is directed to embodiments of the present disclosure, other and further embodiments of the disclosure may be devised without departing from the basic scope thereof, and the scope thereof is determined by the claims that follow.

The invention claimed is:

1. A process chamber, comprising:
a lamp comprising a lamp electrical connector and an engaging feature formed on an exterior surface of the lamp electrical connector;
a lamp assembly housing having a passage for receiving the lamp;
a power distribution assembly having a receptacle for receiving the lamp electrical connector; and
an insulating spacer plate disposed between the lamp assembly housing and the power distribution assembly, wherein the insulating spacer plate has:
a passage contoured to allow passage of the lamp electrical connector therethrough;
a channel formed within the insulating spacer plate, the channel extending in substantially perpendicular relationship with a longitudinal direction of the passage of insulating spacer plate; and
a first laterally operative element positioned to slide axially within the channel to engage or disengage the engaging feature.

2. The process chamber of claim 1, wherein the first laterally operative element is a spring-loaded pin or bar.

3. The process chamber of claim 2, wherein the retention feature is a circumferential notch contoured to receive the spring-loaded pin or bar.

4. The process chamber of claim 1, wherein the receptacle of the power distribution assembly has a contact feature provided on sidewalls of the receptacle, the contact feature engages or disengages with a second laterally operative element provided on the exterior surface of the lamp electrical connector.

5. The process chamber of claim 4, wherein the contact feature is a circumferential groove and the second laterally operative element is a cantilever-type spring contact.

6. The process chamber of claim 1, wherein lamp assembly comprises:
a light transmissive capsule containing a filament; and
a press seal coupling to the light transmissive capsule, the press seal encapsulates and creates a hermetic seal about a metal foil disposed therein, wherein the metal foil electrically connects to the filament by a filament lead, and the metal foil is in electrical communication with the lamp electrical connector extending out of the press seal.

7. The process chamber of claim 6, wherein the first laterally operative element is a circumferential groove provided on an exterior surface of the press seal, and the retention feature of the spacer plate is a bump or a flange radially extended outwardly from an inner surface of the spacer plate.

8. The process chamber of claim 6, wherein at least the electrical connector exposed outside the press seal is covered by an insulating coating a cover.

9. The process chamber of claim 8, wherein the insulating coating comprises high temperature plastic, iron oxide filled silicone, high temperature epoxy, high temperature phenolic resin, polyimide, ceramic or glass slip.

10. The process chamber of claim 8, wherein the cover comprises high temperature plastic shrink or regular tubing, braided glass, silica, or woven ceramic fabric.

* * * * *